United States Patent
Becker et al.

(10) Patent No.: US 12,163,213 B2
(45) Date of Patent: Dec. 10, 2024

(54) GRADED HYDROGEN-FREE CARBON-BASED HARD MATERIAL LAYER COATED ONTO A SUBSTRATE

(71) Applicant: Oerlikon Surface Solutions AG, Pfäffikon, Pfäffikon (CH)

(72) Inventors: Jürgen Becker, Geisenheim (DE); Neir Beganovic, Buchs (CH); Johann Karner, Triesen (LI); Timea Stelzig, Boppard (DE); Jörg Vetter, Bergisch Gladbach (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 63 days.

(21) Appl. No.: 17/631,842

(22) PCT Filed: Jul. 31, 2020

(86) PCT No.: PCT/EP2020/071693
§ 371 (c)(1),
(2) Date: Jan. 31, 2022

(87) PCT Pub. No.: WO2021/019084
PCT Pub. Date: Feb. 4, 2021

(65) Prior Publication Data
US 2022/0275498 A1 Sep. 1, 2022

Related U.S. Application Data

(60) Provisional application No. 62/880,913, filed on Jul. 31, 2019.

(51) Int. Cl.
*C23C 14/06* (2006.01)
*C23C 14/02* (2006.01)
(Continued)

(52) U.S. Cl.
CPC ........ *C23C 14/0605* (2013.01); *C23C 14/021* (2013.01); *C23C 14/025* (2013.01);
(Continued)

(58) Field of Classification Search
None
See application file for complete search history.

(56) References Cited

U.S. PATENT DOCUMENTS

2013/0221548 A1* 8/2013 Iwahori ................... B29C 33/56
428/408
2018/0371608 A1* 12/2018 Moriguchi ............ C23C 28/044

FOREIGN PATENT DOCUMENTS

CN 109402577 A * 3/2019 ......... C23C 14/0605
EP 795622 A1 * 9/1997 ......... C23C 14/0605
(Continued)

OTHER PUBLICATIONS

Machine Translation of JPH11100294A, retrieved Dec. 12, 2023.*

*Primary Examiner* — David P Turocy

(57) ABSTRACT

A method to produce a hard coating onto a substrate, wherein the hard coating comprises a hydrogen-free amorphous carbon coating, wherein the amorphous carbon coating is deposited onto the substrate using a cathodic arc discharge deposition technique, wherein a bias voltage is applied to the substrate with an absolute value that is greater than 0 V, preferably greater than 10 V and less than 1000 V, and wherein the absolute value of the bias voltage is increased during the coating process to obtain a first structure and a second structure and a gradient between the first and the second structure along the coating thickness, wherein the first and the second structure comprise sp2 and sp3 carbon bonds but differ in their relative concentration,
(Continued)

wherein at least one coating pause is applied during the coating process in order to reduce the substrate temperature during the coating pause.

20 Claims, 4 Drawing Sheets

(51) Int. Cl.
    *C23C 14/32*     (2006.01)
    *C23C 14/54*     (2006.01)

(52) U.S. Cl.
    CPC .......... *C23C 14/325* (2013.01); *C23C 14/541* (2013.01); *C23C 14/548* (2013.01)

(56) References Cited

FOREIGN PATENT DOCUMENTS

| | | | | |
|---|---|---|---|---|
| EP | 2432915 A1 | | 3/2012 | |
| JP | 11100294 A | * | 4/1999 | ........... C23C 16/029 |
| JP | 2001192864 A | * | 7/2001 | ......... C23C 14/0605 |
| WO | WO-2018179708 A1 | * | 10/2018 | ........... C23C 14/025 |
| WO | 2018235750 A1 | | 12/2018 | |

* cited by examiner

Figure 5 a)

Mahr Tactile Roughness Measurement

| Kobo Nr. | Rz | Rpk | Rvk | Rpkx | Rvkx | RfpH5n(F) |
|---|---|---|---|---|---|---|
| | µm | µm | µm | µm | µm | µm |
| #190607_001_S1_E8 as coated | 1.47 | 0.32 | 0.12 | 1.24 | 0.45 | 4.05 |
| #190607_001_S1_E8 finished 14 secs | 0.460 | 0.019 | 0.10 | 0.037 | 0.52 | 0.11 | b)

Confovis 3D Optical Measurement

| Kobo Nr. | Spk/µm | Vmp/µm | 0.15µm Threshold Total Number of Grains /µm | 0.6µm Threshold Total Number of Grains /µm | Layer thickness | GKV= Counterpart wear |
|---|---|---|---|---|---|---|
| | µm | µm | | | µm | µm |
| #190607_001_S1_E8 as coated | 0.170 | 0.0089 | 3503 | 277 | 1.35 | 150 |
| #190607_001_S1_E8 finished 14 secs | 0.028 | 0.0001 | 37 | 0 | 1.35 | 2.5 |

GRADED HYDROGEN-FREE CARBON-BASED HARD MATERIAL LAYER COATED ONTO A SUBSTRATE

TECHNICAL BACKGROUND

Carbon-based hard coatings, in particular tetrahedral amorphous carbon coatings (ta-C) are used in industrial application due to their remarkable tribological properties In particular hydrogen-free amorphous carbon layers can have layer hardnesses of 40 GPa or more and E-Modulus of 300 GPa or more. Typical coating thicknesses of ta-C coatings can vary from 0.2 µm to 30 µm, in particular between 0.7 and 2 µm. These coatings are defined according to VDI 2840 (Carbon Layers—Fundamentals, Coating Types and Properties) or ISO 20523 (Carbon Based Films—Classification and Designations).

To produce these specific coatings, high energy physical vapor deposition (PVD) processes are necessary. A common used PVD method is the cathodic arc evaporation technique. This process allows to produce energies of about 100 eV per atom which is then implanted into the growing coating. For the formation of ta-C structures the substrate temperatures must be lower than 165° C., which is low in comparison to the high energy of the impinging particles. At higher substrate temperatures undesired sp2 bonds (graphite bonds) are formed in addition to the desired sp3 bond (diamond bond) even in relatively high proportions.

Underlying Problem

The major challenge in cathodic arc evaporation is the unavoidable formation of macroparticles, which are incorporated as droplets into the layer. These droplets must be removed in post-treatment especially when the coating is used in tribological systems, such as bearing, in particular bearing piston pin/connecting rod eye. Post-treatment can include sanding or grinding, in order to smoothen the surface and avoiding the wear due the presence of the droplets. Since ta-C coatings are very hard, these finishing methods are time consuming and expensive.

There are methods and devices that can be installed into the coating machine to reduce the production of droplets during the coating process which are known as arc-filtering. However, the implementation of these filters reduces drastically the deposition rate which have a negative impact on the coating costs.

OBJECTIVE OF THE INVENTION

It is an objective of the invention to provide a method to produce a hard coating onto a substrate with a, preferably high, deposition rate, wherein the hard coating comprises, preferably only a few, droplets. It is another objective of the invention to provide a workpiece with a hard coating coated thereon.

This task of the invention is solved by a method as claimed in claim 1 and by a workpiece according to claim 14.

Ta—C coatings having hardnesses of more than about 40 GPa and high E-modulus of more than about 300 GPa. The substrate material has a typical hardnesses of about 6 GPa and E-modulus of approximately 200 GPa. As a result, the substrate and the hard coating can behave differently under load. As another result, due to the difference of the elastic and mechanical properties between the substrate and the hard coating, deformation and later cracks can start to form, eventually until a delamination of the coating occurs. This is sometimes referred to as the "egg shell" effect which illustrates the effect of hard shell wrapped around a soft core. An intermediate adhesion layer can be deposited prior the hard coating layer in order to compensate for the mismatch of the elastic and mechanical properties and therefore reduce the risk of delamination of the coatings during operation.

In tribological configurations, where two moving bodies are put into contact, if the body and counter-body have comparable hardness, abrasion effects start to occur. Both friction counterparts will get smoothed surfaces by the interaction with each other. In the case that only one of the bodies is coated with ta-C, the abrasion effect only occurs to the body that has no coating. This can produce very smooth surfaces after losing material on the surface due to the wear.

The production of hydrogen-free carbon-based coatings having different hardnesses at different location of the coating over the coating thickness can have several technical and economic advantages.

A low hardness of the coating at the interface between the surface of the substrate and the coating can reduce the stresses due to the mismatch of the E-Modulus and Hardness between hard coating and substrate, which is advantageous against the crack formation in the coating or even against the delamination of the coating. In some case, one could even go without the need of an intermediate adhesion layer to compensate for the different properties between the coating and substrate.

Further towards the outer surface of the coating, a higher hardness is preferred so that the wear resistance and the desired tribological properties can be ensured during operation. However, on the other hand, it would also be advantageous to have a lower hardness at the surface of the coating in order to reduce the costs and effort of the necessary post-treatment processes to smoothen the surface and to remove the droplets.

In some other special use of tribological systems, it is desirable to not have a hard top layer, but in the contrary to have one of the body rubbing against the other, that has a coating which can act like an abradable coating. In that case, the surface of the coated body gets smoother while the two bodies are put into mechanical contact with each other, but at the same time keeping the two bodies as close as possible without losing their wear resistance property.

The objective of the invention is to produce the different hardness and variations of the properties of the hydrogen-free carbon-based coating, described before, gradually along the coating thickness by applying and varying different coating parameters during one unique process run. This can be mainly done by varying the bias voltage on the substrate (which have normally negative values), preferably varying the deposition rate through the arc current itself and controlling the coating temperature (i.e. surface temperature) which is set through the transfer of energy from the coating material onto the substrate.

In particular, by increasing the absolute value of the applied bias voltage and/or increasing the substrate temperature during the coating process, the hydrogen-free carbon-based coating can be changed from amorphous carbon having predominantly sp2 bonds with lower hardness close to the substrate, to a tetrahedral amorphous carbon (ta-C) coating having mostly sp3 bonds with higher hardness preferably anywhere in the middle of the coating and preferably by decreasing the absolute value of the applied bias voltage and/or preferably decreasing the substrate temperature, the coating having predominantly sp3 bonds can be changed again to a predominantly sp2 bonds coating with lower hardness at the outer surface of the coating. The resulting coating will have a lower hardness closer to the substrate and at the outer surface of the coating and a higher hardness anywhere between these two regions.

In a normal coating process without controlling the previously-mentioned coating parameters (bias voltage, substrate temperature), the substrate temperature (i.e. surface temperature) increases continuously due to the high energy of the process which could have different repercussion on the coating properties. For example when the temperature of the substrate exceeds a specific temperature, sp2 bonds are favored and the coating loses the ta-C structure. This means that in the same coating process, it is no longer possible to produce a coating at the outer surface having predominantly sp2 bonds and have the ta-C structure once this specific temperature is reached anytime during the coating process. It is therefore necessary to control both the bias voltage and substrate temperature during the coating process in order to obtain the desired coating transitions. Using the cathodic arc evaporation technique the sp2 bonds start to be predominantly present in the coating at temperatures above about 165° C. In the inventive process, the substrate temperature and structure of the coating can be controlled by applying a negative bias voltage on the substrate which absolute value can be increased by a given rate and applying at least one coating pause during the coating process for at least one minute, preferably several minutes in order to let the substrate cool down during the pause. When the substrate has reached a given lower temperature, the coating process can resume. There can be as many coating pauses as needed in order to keep the substrate temperature, i.e. surface temperature low and to stay in the regime that produces for example predominantly sp3 bonds in the carbon-based coating. This temperature and process control allows to set specific region along the thickness of the coating where either ta-C structures with sp3 bonds or amorphous carbon structure with sp2 bonds can be obtained.

In a preferred embodiment, the increase of the absolute value of the bias voltage can be set by a rate defined by the ratio ($\Delta U/\Delta s$) which is the ratio of the absolute voltage difference to the unit of time. Otherwise, because the deposition rate of the carbon-based coating depends on the coating parameters, the ratio could be referring to the total coating thickness and be defined by a rate ($\Delta U/\Delta d$) which is the ratio between the absolute voltage difference to the difference of coating thickness. For example, an absolute increase of the bias voltage on the substrate from 0 to 200 V for a coating thickness of 1000 nm, could be defined by a ratio $\Delta U/\Delta d$ of 0.2 V/nm. In the preferred embodiment, the absolute increase of the bias voltage during the coating process of the carbon-based coating is greater than 0 V but less than 1000 V, preferably greater than 10 V but less than 1000 V, typically from 10 V to 200 V. The ratio of the increase of the bias voltage with respect to the coating thickness can be set between 0.02 V/nm and 0.5 V/nm, this would correspond to an absolute linear increase of the bias voltage of 100 V over a coating thickness of 5000 nm, and 1000 V over a coating thickness of 2000 nm.

In a special embodiment, instead to increase the absolute bias voltage in a linear manner during the coating process, a preferred way would be to set the ratio of the absolute increase of the bias voltage to different values during the coating process. This way, for example, the region along the coating thickness where the favorable ta-C would be produced could be extended. This effect could be combined with the coating pauses applied during the coating process in order to keep or reduce the temperature in a specific range where ta-C with sp3 bonds is produced.

Other improvement of the hard coating system could be achieved by using pre-treatment of the substrate surface before deposition of the carbon-based coating, such as metal-ion etching (MIE) or the addition of a very thin adherence layer, such as a Cr-based layer, which can be produced using the residual Cr from the previous metal-ion etching process.

Another advantage of the invention, as described before, is the possibility to post-process the surface of the carbon-based coating which would have a reduced hardness than the core of the coating. Surface smoothening processes and droplet removal, can include, sanding, grinding, in particular band-finishing. Which is described more in detail below.

Band finishing is a process where the part to be processed, for example a piston pin is mounted on a rotatable spindle. Another part called "finisher" is then pressed against the workpiece via a slowly advancing belt with defined air pressure. The tape on the belt with a SHORE-Hardness of about A 65° or about A 85°, preferably between about A 65° and A 85°, rotates with the belt and rubs against the workpiece. The choice of the tape material (grain type, grain size, weave style) is essential to the finish result. In particular, diamond microfinishing tape material is used having grain sizes between about 9 µm and about 30 µm depending on the finish wanted and the time to finish the surface. Preferably for the best finishing result a grain size of diamond tape of about 9 µm is used together with the belt of a SHORE-Hardness of about A 65°. In addition to the feed, the finisher can also oscillate left and right along the axis of the rotating workpiece in order to create a so-called cross-finish. A cooling lubricant is often used in order to reduce the overheating of the tape during the grinding process but is not always necessary. Typical roughness values for the unfiltered bias-ramp layer before (as-coated) and after finish can be decreased typically from Rz=1.5 down to 0.5 µm. The target values for the roughness and optimum values shown in parenthesis have been found to be Spk<0.4 µm (0.3 µm), Rpk<0.5 µm (0.3 µm), Rpkx<0.2 µm (0.1 µm), RfpH5n(F) <0.6 µm (<0.3 µm), GKV<6 µm (3 µm). More detailed values are shown in the FIG. 5.

Roughness measurement is critical, in particular for coatings produced by cathodic arc discharge with the presence of the droplets in the coating which should also be taken into account in the roughness measurement. Optical methods, such as developed by Confovis, combined with special designed algorithms can be used to count the droplets on the surface and characterize the effectivity of the finishing method.

The process steps to illustrate the production of a tetrahedral carbon layer (ta-C) using cathodic arc evaporation on steel substrates are as follow:

Pre-Heating

The substrate are heated to about 150° C. in a vacuum chamber using integrated radiation heaters. The substrate are rotated at different degrees of freedom, either a single, double or triple rotation for an optimum heat distribution on the surface.

Etching

In a second step, the substrates are etched with argon ions. The etching is carried out by a so-called "advanced energy glow discharge" (AEGD) technology. In the coating chamber, the titanium targets intended for this purpose are operated behind a shutter (shutter at chamber potential) by means of an arc having a target current of 100 A. The resulting titanium ions ($Ti^+$) are captured by the shutter. With a positive potential, the electrons produced by the ionization of the titanium are conducted through rod anodes. During this phase, the argon flow is pressure-controlled and fed into the coating chamber which is at about $1\times10^{-2}$ mbar. The ionized argon (Ark) is directed towards the substrate through a negative bias voltage of −200V. The etching of the surface is then done by ion bombardment.

Chromium-MIE (Chromium-Metal-Ion-Etching)

Under high vacuum at $1.3\times10^{-3}$ mbar and an argon flow of about 178 sccm, chromium targets are ignited by a trigger wire and then operated at a target current of 80 A. The result is an arc, which can move on the target through the use of magnetic fields on the target surface. By applying a negative bias voltage of −800 V to the substrate, the chromium ions ($Cr^+$) are strongly accelerated from the targets to the substrate. Oxides can be removed on the surface thanks to the high impact of these ions onto the surface and at the same time the ions can penetrate into substrate material, producing an implantation of chromium ions. In addition, a very thin chromium layer of 20-100 nm can be produced by the rest of Chromium that is present at the surface. Chromium-metal-ion etching (Cr-MIE) ensures a smooth transition at the interface between the substrate and the layer material. In addition, the chromium implantation acts as a kind of anchor in the substrate ensuring a good adhesion of the layer. Since the Cr-MIE is a high energy process step the substrate can get quite hot. It is therefore necessary to apply some pauses in order to keep the substrate temperature below the tempering temperature of the substrate material.

Cooling Period

Before the application of the carbon-based coating the substrate is cooled to about 100° C. to ensure good adhesion between the thin chromium layer and the carbon layer. During the cooling phase the substrate are rotated into the vacuum chamber. The cooling time can vary depending on the mass and volume of the substrate Carbon Transition Layer (C-Interlayer)

At a process pressure between $1\times10^{-3}$ to $2\times10^{-3}$ mbar, preferably about $1.7\times10^{-3}$ mbar and an argon flow between 50 and 80 sccm, preferably about 64 sccm carbon doping is carried out. The argon is introduced by means of gas showers directly in front of the carbon targets. The carbon targets are ignited by trigger wire and operated at a target current between 40 and 55 A, preferably of about 45 A. The resulting carbon ions ($C^+$) are then accelerated onto the substrate by a bias voltage of −500 to −300 V, preferably −500 V. This leads to an implantation of the carbon into the thin chromium layer. The absolute value of the negative bias voltage can then be reduced from −500V to −150V.

Carbon-Based Coating Process (Ta—C Coating)

The carbon-based coating, in particular ta-C coating is produced at a process pressure between $1\times10^{-3}$ and $2\times10^{-3}$ mbar, preferably of about $1.3\times10^{-3}$ mbar and an argon flow between 80 and 100 sccm, preferably of about 90 sccm. In this case, the carbon targets are operated at a lower target current of 25 to 35 A. The absolute value of the negative bias voltage is increased at a given rate (ramp) over the entire coating time from 0 to −200 V. The target current of the carbon targets is kept constant. Applying a ramp of the bias voltage has the advantage that at the beginning of the coating a ta-C layer with lower hardness can be produced. Increasing the bias voltage afterwards creates harder layer in the range between 40 and 50 GPa. At bias voltages of about −160 V and substrate temperature close to 160° C., the proportion of sp2 bonds is increased whereas the proportion of sp3 bonds is reduced. This results in a graphite-like top layer, which has a significantly lower hardness than the core of the coating of about 15 to 30 GPa. The top layer with low hardness has the significant advantage that the layer can be finished more easily.

Further advantages, effects and details of the invention are given in the description and the enclosed drawings. It is understood that the features mentioned above and those yet to be explained below can be used not only in the combination indicated in each case but also in other combinations or in a unique position without leaving the scope of the present invention.

The invention is shown schematically in the drawings on the basis of embodiments and is further described with reference to the drawings.

FIG. 1 shows a carbon-based coating build up from left to right showing different coating structures along the coating thickness. Temperature of the substrate is shown in red, bias voltage is shown in blue. The different coating structures are visible in the three regions marked by A, B, C.

FIG. 5 shows a table with the different roughness values before and after the surface finish of the coating using a) classical methods and b) optical method.

Figure 1:
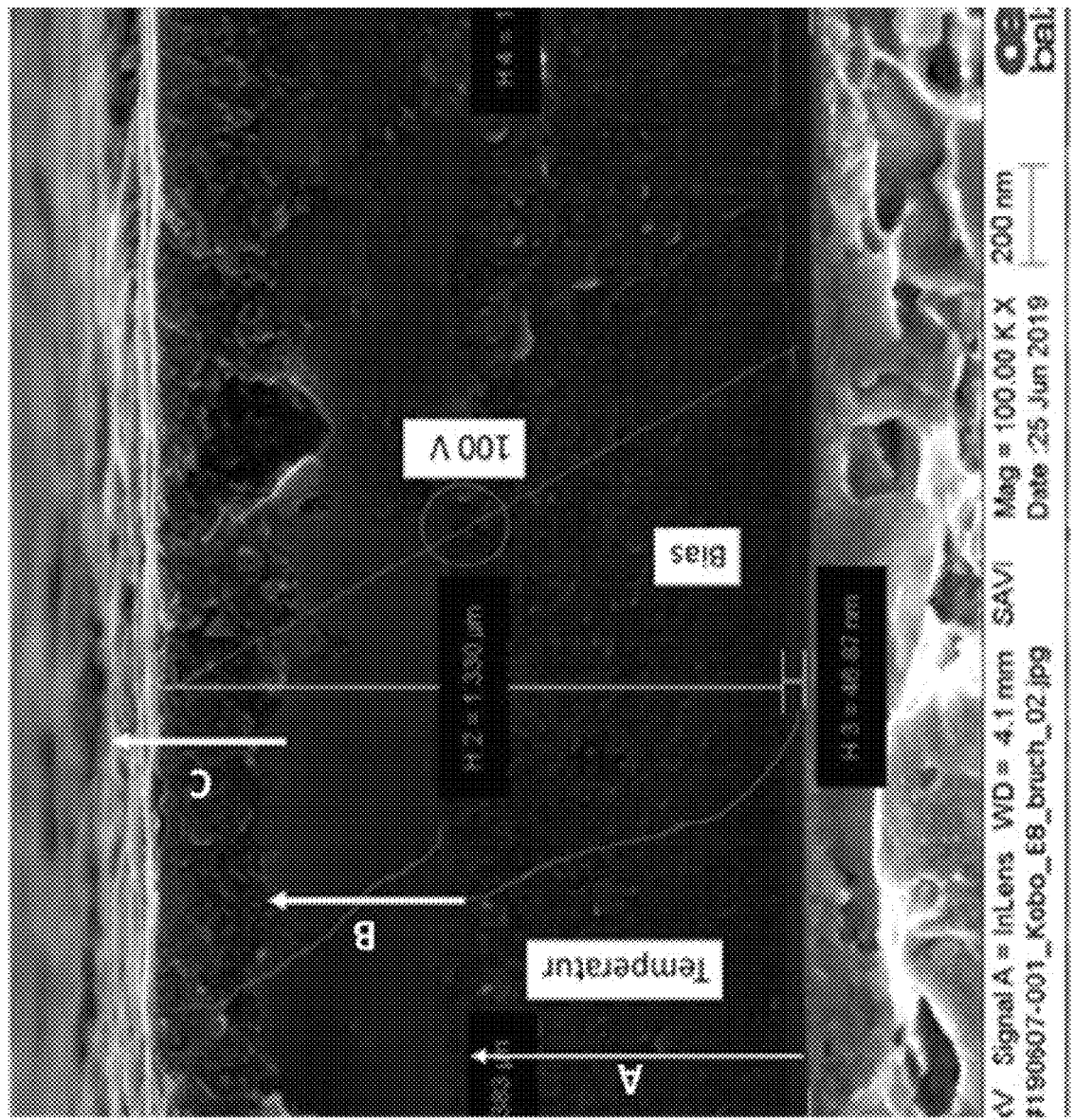

FIG. 1 shows the carbon-based coating build up from left to right showing the different coating structures along the coating thickness. Temperature of the substrate is shown in red, bias voltage is shown in blue. The coating can be split in 3 ranges A, B, C. The region A close to the substrate corresponds to a fine structure having a coating thickness between 200 to 1000 nm, preferably about 700 nm, where the absolute bias voltage is increased from 10 V to 100V and substrate temperature increases from about 140 to 180° C. The coating pause between the region A and B induces a drop in the substrate temperature of about 20° and afterwards when the bias current is increased from 100 V to 150 V, the temperature increases from about 160° C. to 190° C. The coating in region B is vitreous and more dense (ta-C) with a coating thickness range of 200 to 500 nm, preferably about 400 nm. Region C shows a more porous and rough coating, where the absolute bias voltage is increased from 150 V to 200 V, there the substrate temperature increases from 190° C. to 220° C. In this region of the coating sp2 bonds are predominant and the coating has a reduced hardness and the coating thickness is in the range of 200 to 500 nm, preferably about 400 nm.

Figure 2:
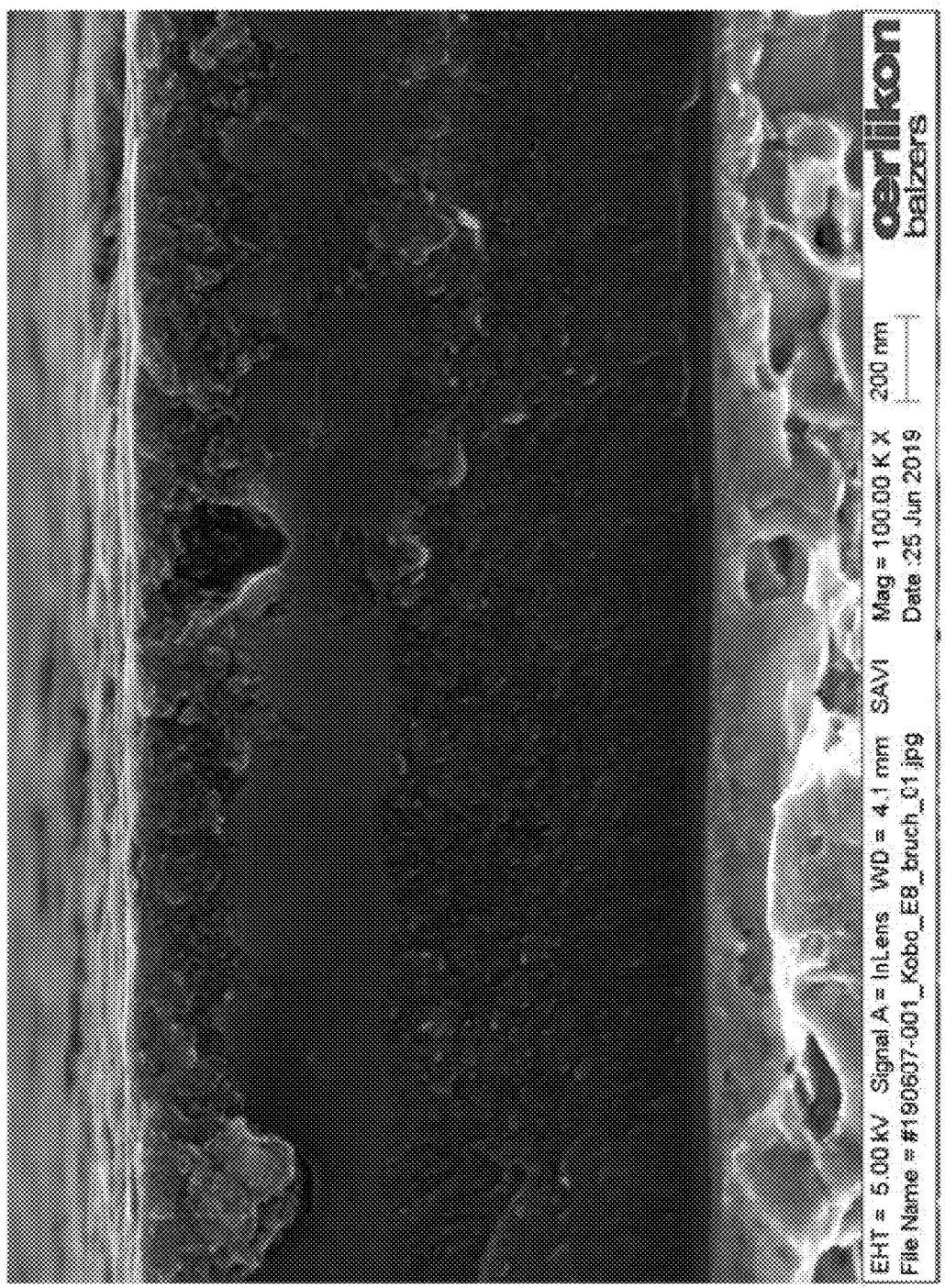
FIG. 2 shows the same cross-section as FIG. 1 without the legend and higher contrast to show the difference between the coating structures along the coating thickness.

FIG. 2 shows the same cross-section as FIG. 1 without the legend and higher contrast to show the difference between the coating structures along the coating thickness.

Figure 3:
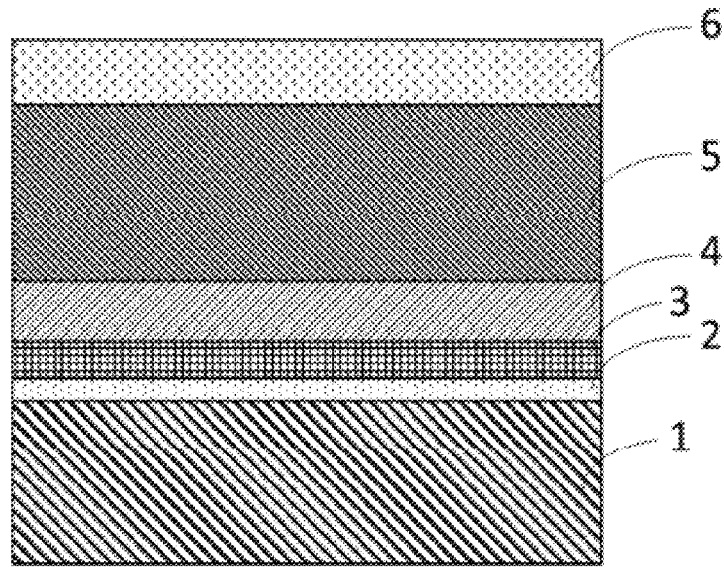
FIG. 3 shows a coating as described by the present invention. (1) is the substrate, (2) Cr-layer, (3) C-interlayer, (4) ta-C at low bias voltage (0-20 V), (5) ta-C at intermediate bias voltage (20-160 V) and (6) the ta-C top layer at bias voltages (160-200 V).

FIG. 3 shows a coating as described by the present invention with absolute values of bias voltage as illustration. (1) is the substrate, (2) Cr-layer, (3) C-interlayer, (4) ta-C at low bias voltage (0-20 V), (5) ta-C at intermediate bias voltage (20-160 V) and (6) the ta-C top layer at bias voltages (160-200 V).

Figure 4:
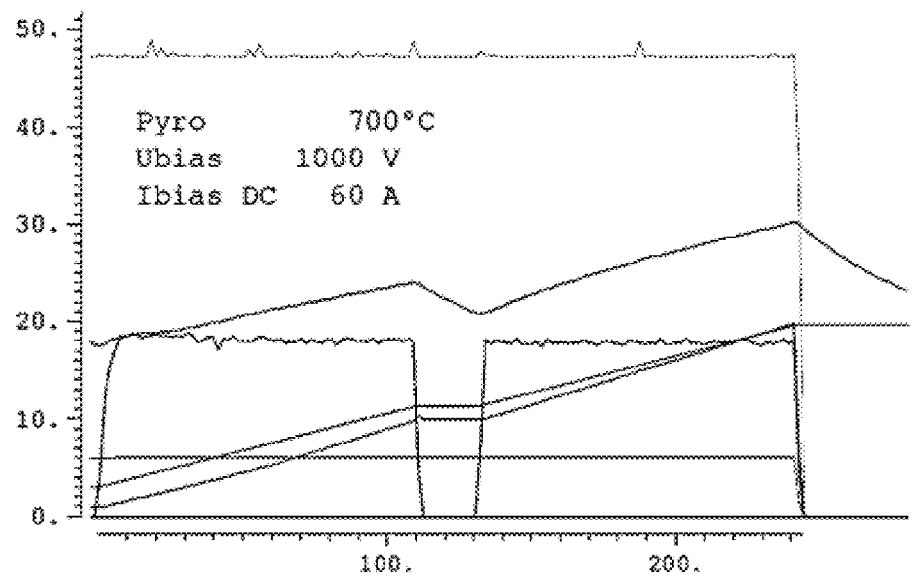
FIG. 4 shows the relevant process data such as cathodic arc current, absolute bias voltage, gas flow and substrate temperature, where the values in the legend represents the full scale at 100. The X-Axis represents the time in minutes.

FIG. 4 shows some relevant process data such as cathodic arc current, absolute bias voltage, gas flow and substrate temperature, where the values in the legend represents the full scale at 100. The X-Axis represents the time in minutes. The coating process in this example is represented by the dark blue line which is the input of the cathodic arc current and lasts about slightly more than 200 minutes, at about 100 minutes the process is interrupted to apply the coating pause of about 20 minutes, and afterwards the coating process continues until the desired coating thickness is reached. During the whole coating time of 200 minutes, including the coating pause, the absolute bias voltage, which is represented by the green line, is increased from 10 V to 200 V. During the break there is no coating process and the bias voltage remains constant but has no effect on the substrate. The positive effect of the coating pause can be seen on the substrate temperature that is dropping from 175° C. down to 140° C. resulting to a favorable temperature to create more sp3 bonds for a longer period of time, consequently a larger region on the coating where ta-C structure is present. The different data and ramps, such as the increase rate of the absolute bias voltage, the time of coating, the time of coating pause and number of coating pause are just shown as illustration. For example a different increase rate of the absolute bias voltage could be chosen between each interruption of the coatings or the coating could be interrupted more than one time, or the coating pause could last less or more than 20 minutes but not shorter than 1 minute.

FIG. 5 shows typical roughness values for the unfiltered bias-ramp layer before (as-coated) and after finish can be decreased typically from Rz=1.5 down to 0.5 µm. The target values for the roughness and optimum values shown in parenthesis have been found to be Spk<0.4 µm (0.3 µm), Rpk<0.5 µm (0.3 µm), Rpkx<0.2 µm (0.1 µm), RfpH5n(F) <0.6 µm (<0.3 µm), GKV<6 µm (3 µm).

The invention claimed is:

1. A method for producing a hard coating onto a substrate, comprising:
    depositing the hard coating onto a steel substrate, wherein the hard coating comprises a hydrogen-free amorphous carbon coating that is also referred to as a hydrogen-free carbon-based coating, wherein the hydrogen-free amorphous carbon coating is the only amorphous carbon coating in the hard coating and the hydrogen-free amorphous carbon coating is deposited using a cathodic arc discharge deposition technique, wherein:
        a bias voltage is applied to the substrate with an absolute value that is greater than 0 V and less than 1000 V, and wherein the absolute value of the bias voltage is increased during the coating process to obtain a first structure and a second structure and a gradient between the first structure and the second structure along a coating thickness, wherein the first structure and the second structure comprise sp2 and sp3 carbon bonds but differ in their relative concentration, and
        by increasing the absolute value of the applied bias voltage or by increasing the absolute value of the applied bias voltage and increasing a substrate temperature during the coating process, in any case without decreasing at any time the absolute value of the applied bias voltage during the deposition of the hydrogen-free amorphous carbon coating, and by applying at least one coating pause during the coating process in order to reduce the substrate temperature during the coating pause, the hydrogen-free carbon-based coating is produced having different coating structures visible in three regions A, B, and C, wherein the hydrogen-free amorphous carbon coating is formed of the three regions A, B, and C, wherein region A is applied closer to the substrate than regions B and C, region B is applied directly on top of region A, and region C is applied directly on top of region B, and wherein region B has more sp3 bonds and higher hardness than region A and region C, respectively, and
    region C is applied forming an outermost surface of the hard coating.

2. The method according to claim 1, wherein the coating pause lasts at least one minute.

3. The method according to claim 1, wherein the increase of the absolute value of the bias voltage is set by a rate defined by a ratio ΔU/Δs, which is a ratio of the absolute voltage difference to a unit of time.

4. The method according to claim 1, wherein the increase of the absolute value of the bias voltage is set by a rate defined by a ratio of ΔU/Δd, which is a ratio between the absolute voltage difference to a difference of coating thickness.

5. The method according to claim 4, wherein the ratio of ΔU/Δd is between about 0.02 V/nm and about 0.5 V/nm.

6. The method according to claim 1, wherein the absolute value of the bias voltage is increased in a linear manner.

7. The method according to claim 1, wherein the absolute value of the bias voltage is increased stepwise during the coating process.

8. The method according to claim 1, wherein before the hard coating is coated onto the substrate, the substrate is pre-heated to about 150° C. in a vacuum chamber.

9. The method according to claim 8, comprising cooling the substrate to about 100° C. after the pre-heating and before applying the coating to the substrate to ensure good adhesion.

10. The method according to claim 8, comprising using an integrated radiation heater to pre-heat the substrate.

11. The method according to claim 1, wherein before coating the substrate, the substrate is pre-treated by using metal-ion etching (MIE) and/or by adding a very thin adherence layer having a thickness in a range from 20 to 100 nm.

12. The method according to claim 11, wherein before coating the substrate, the substrate is pre-treated by adding a very thin Cr-based layer as the adherence layer, and wherein the very thin Cr-based layer has a thickness in a range from 20 to 100 nm.

13. The method according to claim 1, comprising coating the substrate with a carbon transition layer, which is a C-interlayer, at a process pressure between $1 \times 10^{-3}$ to $2 \times 10^{-3}$ mbar and carrying out carbon doping at an argon flow between 50 and 80 sccm, wherein the argon is introduced through gas showers in front of carbon targets, wherein the carbon targets are ignited by trigger wire and operated at a target current between 40 and 55 A, wherein resulting carbon ions are then accelerated onto the substrate by a bias voltage between −500 V and −300 V, which leads to an implantation of the carbon into a thin chromium layer, wherein the value of the bias voltage is then reduced from −300V to −150 V.

14. The method according to claim 1, wherein a surface of the carbon-based coating is post-processed by sanding, grinding, and/or band-finishing.

15. The method according to claim 1, wherein:
    region A closest to the substrate has a coating thickness between 200 and 1000 nm formed by increasing the bias voltage from 10 V to 100 V and increasing the substrate temperature from about 140 to 180° C.;

the coating pause between region A and region B induces a drop in the substrate temperature of about 20°;

region B has a coating thickness between 200 and 500 nm formed by increasing the bias voltage from 100 V to 150 V and increasing the substrate temperature from about 160° C. to 190° C.; and region C has a coating thickness between 200 and 500 nm formed by increasing the bias voltage from 150 V to 200 V and increasing the substrate temperature from 190° C. to 220° C.

16. The method according to claim 1, wherein:

region A is formed by increasing the bias voltage in a range from about 10 V to 100 V and increasing the substrate temperature in a range from about 140 to 180° C.;

region B is formed by increasing the bias voltage in a range from about 100 V to 150 V and increasing the substrate temperature in a range from about 160° C. to 190° C.; and region C is formed by increasing the bias voltage in a range from about 150 V to 200 V and increasing the substrate temperature in a range from about 190° C. to 220° C.

17. The method according to claim 1, comprising applying the hydrogen-free amorphous coating in one of the following manners:

directly onto the steel substrate, directly onto a carbon transition layer previously applied directly onto the steel substrate, or directly onto a carbon transition layer previously applied onto an adhesion layer directly applied onto the steel substrate.

18. The method according to claim 17, wherein the adhesion layer is a Cr-based layer.

19. A method for producing a coated surface consisting of a hard coating deposited onto a substrate, the method comprising:

depositing the hard coating onto a steel substrate, wherein the hard coating comprises a hydrogen-free amorphous carbon coating that is also referred to as a hydrogen-free carbon-based coating, wherein the hydrogen-free amorphous carbon coating is the only amorphous carbon coating in the hard coating and the hydrogen-free amorphous carbon coating is deposited using a cathodic arc discharge deposition technique, wherein:

a bias voltage is applied to the substrate with an absolute value that is greater than 0 V and less than 1000 V, and wherein the absolute value of the bias voltage is increased during the coating process to obtain a first structure and a second structure and a gradient between the first structure and the second structure along a coating thickness, wherein the first structure and the second structure comprise sp2 and sp3 carbon bonds but differ in their relative concentration, and by increasing the absolute value of the applied bias voltage or by increasing the absolute value of the applied bias voltage and increasing a substrate temperature during the coating process, in any case without decreasing at any time the absolute value of the applied bias voltage during the deposition of the hydrogen-free amorphous carbon coating, and by applying at least one coating pause during the coating process in order to reduce the substrate temperature during the coating pause, the hydrogen-free carbon-based coating is produced having different coating structures visible in three regions A, B, and C, wherein the hydrogen-free amorphous carbon coating is formed of the three regions A, B, and C, wherein region A is applied closer to the substrate than regions B and C, region B is applied directly on top of region A, and region C is applied directly on top of region B, and wherein region B has more sp3 bonds and higher hardness than region A and region C, respectively, and region C is applied forming an outermost surface of the hard coating and forming an outermost surface of the coated substrate.

20. A method for producing a hard coating onto a substrate, comprising:

depositing the hard coating onto a steel substrate, the hard coating comprising a hydrogen-free amorphous carbon coating that is a hydrogen-free carbon-based coating, using a cathodic arc discharge deposition technique, wherein a bias voltage is applied to the substrate with an absolute value that is greater than 0 V and less than 1000 V, and wherein the absolute value of the bias voltage is increased during the coating process to obtain a first structure and a second structure and a gradient between the first structure and the second structure along a coating thickness, wherein the first structure and the second structure comprise sp2 and sp3 carbon bonds but differ in their relative concentration, wherein by increasing the absolute value of the applied bias voltage and/or increasing a substrate temperature during the coating process, the hydrogen-free carbon-based coating has a different structure in three regions A, B, and C, wherein region A is closest to the substrate with region A being either directly applied to the substrate or with an optional adhesion and/or carbon transition layer positioned between region A and the substrate, region B is applied on top of region A, and region C is applied on top of region B, and wherein regions A and C have predominantly sp2 bonds while region B has mostly sp3 bonds with higher hardness than region A closest to the substrate and region C at an outer surface both having predominantly sp2 bonds, and applying at least one coating pause during the coating process in order to reduce the substrate temperature during the coating pause, wherein:

region A is formed by increasing the bias voltage from about 10 V to 100 V and increasing the substrate temperature from about 140 to 180° C.;

the coating pause between region A and region B induces a drop in the substrate temperature of about 20°;

region B is formed by increasing the bias voltage from about 100 V to 150 V and increasing the substrate temperature from about 160° C. to 190° C.; and region C is formed by increasing the bias voltage from about 150 V to 200 V and increasing the substrate temperature from about 190° C. to 220° C.

* * * * *